(12) United States Patent
Lee et al.

(10) Patent No.: US 6,896,736 B2
(45) Date of Patent: May 24, 2005

(54) PHOTORESIST PURGE CONTROL OF SEMICONDUCTOR WAFER COATING EQUIPMENT

(75) Inventors: Kwang-Ho Lee, Suwon (KR); Jung-Hong Kim, Osan (KR); Jong-Hwa Lee, Dajeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 10/412,586

(22) Filed: Apr. 14, 2003

(65) Prior Publication Data

US 2004/0067307 A1 Apr. 8, 2004

(30) Foreign Application Priority Data

Oct. 4, 2002 (KR) ................................ 10-2002-0060486

(51) Int. Cl.[7] .............................................. B05C 11/00
(52) U.S. Cl. ........................ 118/702; 118/703; 118/699
(58) Field of Search ................................ 118/699, 702, 118/703, 700, 701, 695, 696, 697, 708; 239/120, 407, 569, 112, 113

(56) References Cited

U.S. PATENT DOCUMENTS 3,992,301 A * 11/1976 Shippey et al. .............. 210/636
5,330,101 A *  7/1994 Turner et al. ................ 239/112
6,332,924 B1   12/2001 Shim et al.

\* cited by examiner

Primary Examiner—J. A. Lorengo
Assistant Examiner—George Koch
(74) Attorney, Agent, or Firm—Volentine Francos & Whitt, PLLC

(57) ABSTRACT

The purging of photoresist from a supply device of semiconductor coating equipment is automatically executed in a controlled manner. The equipment employs a plurality of photoresist bottles for storing the same kind of photoresist. A plurality of supply pipes are respectively connected to the photoresist bottles, respectively. A valve system selectively opens and closes the supply pipes in response to control signals generated by a main controller. A dispense pump forces the photoresist in the open supply pipe through a nozzle. A purge start button issues a purge start command signal to the controller when the button is pressed. The controller then controls the valve system and the dispense pump so as to automatically purge the photoresist according to a sequence effected using a timer.

3 Claims, 4 Drawing Sheets

PHOTORESIST PURGE CONTROL OF SEMICONDUCTOR WAFER COATING EQUIPMENT

BACKGROUND OF THE INVENTION

1. Field of the Invention

The present invention relates to the manufacturing of semiconductor devices. More particularly, the present invention relates to a photoresist purge control device of equipment for coating semiconductor wafers with photoresist.

2. Description of the Related Art

In general, the manufacturing of a semiconductor device includes fabricating, assembly and test processes. For example, the fabricating process may entail subjecting a silicon wafer repeatedly to individual diffusion, photolithography, etching and thin film-forming processes, to thereby form an electric circuit on the wafer. At this time, the fabricating process leaves the wafer in a semi-finished state. The semi-finished wafer is then subjected to the assembly process. In the end, the test process ensures that the electric circuit is operating perfectly.

In the photolithography process, an oxide is formed on the surface of the silicon wafer, to protect a polished surface of the wafer. Photoresist in a liquid state is dispensed onto the oxide, and then the wafer is rotated at a high speed to form a uniform film of the photoresist on the oxide. A mask is disposed over the wafer coated with the photoresist. Light is directed onto the photoresist through the mask and only the portion of the photoresist exposed to the light undergoes a reaction (with the light) that produces a virtual image on the photoresist. Then, the photoresist is developed, whereby the photoresist attains a pattern corresponding to the virtual image. Portions of thin films exposed by the photoresist pattern are selectively removed through an etching process using gas or chemicals to thereby form a corresponding pattern in the thin films. In such a photo-etching process, the quality of the photoresist layer is considerably important in producing the desired pattern in the underlying film(s). For instance, the accuracy of the critical dimension (CD) of the electric circuit depends, in part, upon the thickness of the photoresist deposited on the wafer.

A known device for depositing photoresist on a wafer includes storage bottles containing photoresist, a photoresist deposition pipe connected to the storage bottles and through which photoresist is dispensed onto a wafer, an exchange valve operable to selectively deliver photoresist from the storage bottles to the photoresist deposition pipe, and an auxiliary sensor connected between the exchange valve and the photoresist deposition pipe to sense the amount of photoresist remaining in the line. The auxiliary sensor allows for the prevention of unwanted bubbles from being produced in the photoresist film.

Furthermore, a device for uniformly applying photoresist onto a wafer is disclosed in U.S. Pat. No. 6,332,924 B1. In this device, the photoresist is dispensed through a nozzle onto the wafer, and the amount and pressure of the photoresist is kept constant to ensure that the photoresist is deposited uniformly on the wafer.

Photoresist spraying devices must also be capable of supplying several different types photoresist, because different lots of wafers often require photoresists having different properties. In this case, after first photoresist is dispensed from a first bottle through a supply line onto the wafers of one lot, the supply line is purged to remove any of the first type of photoresist remaining in the supply line. Then, the supply line is connected with another bottle that is filled with a second photoresist having a characteristic different from that of the first photoresist.

FIG. 1 schematically shows such a conventional photoresist supply device. The conventional photoresist supply device includes a plurality of photoresist bottles 10, 12 storing the same kind of photoresist. First and second supply pipes 14, 16 are respectively connected to upper parts of the photoresist bottles 10, 12. First and second sensors 18, 20 are installed in the first and second supply pipes 14, 16 for sensing when the first and second supply pipes 14, 16 are empty, respectively. An air valve 22 connected to the first and second supply pipes 14, 16, can be re-positioned so as to selectively supply the photoresist supplied through the first and second supply pipes 14, 16 in response to a given control signal. A third supply pipe 24 connected to the air valve 22 transfers the photoresist supplied through the pipe opened by the air valve 22 to a dispense pump 26. The dispense pump 26 pressurizes the photoresist supplied through the third supply pipe 24 to force the photoresist through a fourth supply pipe 28. The fourth supply pipe 28 is connected to a nozzle 30 for spraying the photoresist onto a wafer disposed within a coater bowl 32.

A main controller 34 controls the entire wafer coating process. In particular, the main controller is connected to the first and second empty sensors 18, 20 so as receive a photoresist empty state detection signal from the first and second empty sensors 18, 20 whenever one of the first and second supply pipes 14, 16 is empty, and controls the dispense pump 26 on the basis of the input from the first and second empty sensors 18, 20.

FIG. 2 is a flowchart of a conventional method of operating the spray device at the time photoresist bottles are to be changed upon the use of the same device to coat a new lot of wafers.

Referring now to FIGS. 1 and 2, a worker informs an engineer of a lot change once a deposition process of coating a first lot of wafers with photoresist is completed. Upon receiving this information, the engineer keys in a parameter value, representing a mode change of the equipment, to the main controller 34 (101).

At this time, the engineer who was informed of the lot change, checks whether the last wafer has been transferred out of the coater bowl 32 (102), and keys in a command to the main controller 34 to effect a transfer of the wafer if a wafer is still within the coater bowl 32. Once the last wafer has been transferred from the coater bowl 32, the engineer exchanges the first and second photoresist bottles 10, 12 with new bottles in which photoresist having a different characteristic, appropriate for the new lot of wafers, is stored (103).

Subsequently, the engineer keys in information, pertaining to the new photoresist, to the main controller 34 (104). The engineer also inputs a spray start command to the main controller 34. As a result, the main controller 34 drives the air valve 22 to place the first supply pipe 14 in communication with the third supply pipe 24 (105). Then, the main controller 34 drives the dispense pump 26 to spray the photoresist stored in the first photoresist bottle 10 (106) through the nozzle 30.

The engineer visually checks the first photoresist bottle 10 while the photoresist is being sprayed (107). Once ½ of the photoresist stored in the first photoresist bottle 10 has been consumed, the engineer initiates a purge operation. At this time, the engineer separates the first supply pipe 14 from the first photoresist bottle 10 (108).

Subsequently, the first empty sensor 18 senses an empty state, and applies information indicative of the empty state to the main controller 34 (109). At this time, the main controller 34 controls the air valve 22 and places the second supply pipe 16 in communication with the third supply pipe 24.

The engineer monitors the second photoresist bottle 12 by eye to determine when about ⅔ of the photoresist stored in the second photoresist bottle 12 is consumed (110). Consuming about ⅔ of the photoresist of the second photoresist bottle 12 is required to purge the previous photoresist from the second supply pipe 16, and subsequently from the downstream supply pipes 24, 28, so that only new photoresist is present in the line.

Next, the engineer separates the second supply pipe 16 from the second photoresist bottle 12 (111).

Then, the second empty sensor 20 senses an empty state, and issues a signal indicative of the empty state to the main controller 34. At this time, the main controller 34 stops the operation of the dispense pump 26 (112).

Next, the engineer keys in information to the controller 34 that the purge is completed, whereupon the current mode of operation is changed to a run progression mode. Also, the engineer informs a worker that the equipment is now programmed to operate in the run progression mode (113).

As was described above, an engineer has to observe photoresist bottles while the photoresist is being purged, and then separate a supply pipe from the photoresist bottles so that the main controller will judge that the supply pipe is empty. In this case, the engineer has to continuously observe the photoresist bottles for about 40 minutes to one hour. Therefore, a lot of manpower is dedicated to changing the photoresist bottle. If the engineer is not diligent in observing the purging of the photoresist and leaves his/her position, an excessive amount of the photoresist can be purged, i.e., the photoresist can be wasted.

Furthermore, an engineer uses his/her naked eye to sense the amount of the photoresist consumed during the conventional photoresist purge method. The engineer separates the supply pipe from the photoresist bottle when he/she judges that so much of the photoresist has been consumed. Accordingly, different amounts of photoresist may be consumed during purge methods carried out by different engineers.

SUMMARY OF THE INVENTION

Therefore, an object of the present invention is to provide a method of and device for automatically executing the purging of photoresist from semiconductor device coating equipment, thereby minimizing the manpower required for operating the equipment and curtailing costs associated with the process.

Another object of the present invention is to provide a method of and device for controlling the purging of photoresist from semiconductor coating equipment, wherein a precise amount of photoresist can be purged when exchanging photoresist bottles prior to coating a new lot of wafers, thereby preventing an unnecessary consumption of the photoresist and curtailing costs associated with the process.

In accordance with one aspect of the present invention, the photoresist supply device of a semiconductor coating equipment comprises a plurality of photoresist storage bottles, a plurality of supply pipes respectively connected to the plurality photoresist bottles, a supply line connected to the supply pipes downstream thereof, at least one flow direction control valve disposed in-line with the supply pipes upstream of said supply line, a dispense pump operatively connected to the supply line, a nozzle disposed at the end of the supply line, a purge start input member actuatable to issue a purge start command signal, an electronic timer, and a controller.

The at least one valve is and movable, in response to a control signal, to place a selected one of any of the supply pipes in communication with the supply line. The controller is operatively connected to the purge start input member so as to receive the purge start command signal therefrom when the input member is actuated. The controller is also operatively connected to the electronic timer, the dispense pump and the at least one valve so as to control the operations thereof according to a sequence established using the timer. The sequence is such that the supply pipes and the supply line are automatically purged of photoresist once the command signal is received.

More specifically, according to another aspect of the present invention, after the plurality of photoresist storage bottles are exchanged with photoresist storage bottles containing new photoresist, one of said supply pipes is placed in open communication with the supply line while each other supply pipe is prevented from communicating with the supply line.

The timer is initialized to begin measuring off a first predetermined period of time beginning from when the one supply pipe is placed in open communication with the supply line. During this time, new photoresist in the storage bottle connected to the one supply pipe is allowed to flow into the supply pipe connected thereto, and thereby purge that supply pipe.

Once the first predetermined period of time has been measured off, that supply pipe is cut off from the supply line while another of the supply pipes is placed in open communication with the supply line. The timer is also initialized to begin measuring off a second predetermined period of time beginning from when the last one of the plurality of supply pipes is placed in open communication with the supply line. During this second period of time, new photoresist in the storage bottle is allowed to flow into the supply pipe connected thereto and any previous photoresist still in the supply line is purged through the spray nozzle.

The purging operation is stopped upon the lapse of the second predetermined period of time, to ensure that no further amount of photoresist is wasted through the purging of the system.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE PREFERRED EMBODIMENTS

Hereinafter, preferred embodiments of the present invention will be described in detail with reference to FIGS. 3 and 4.

Figure 1:
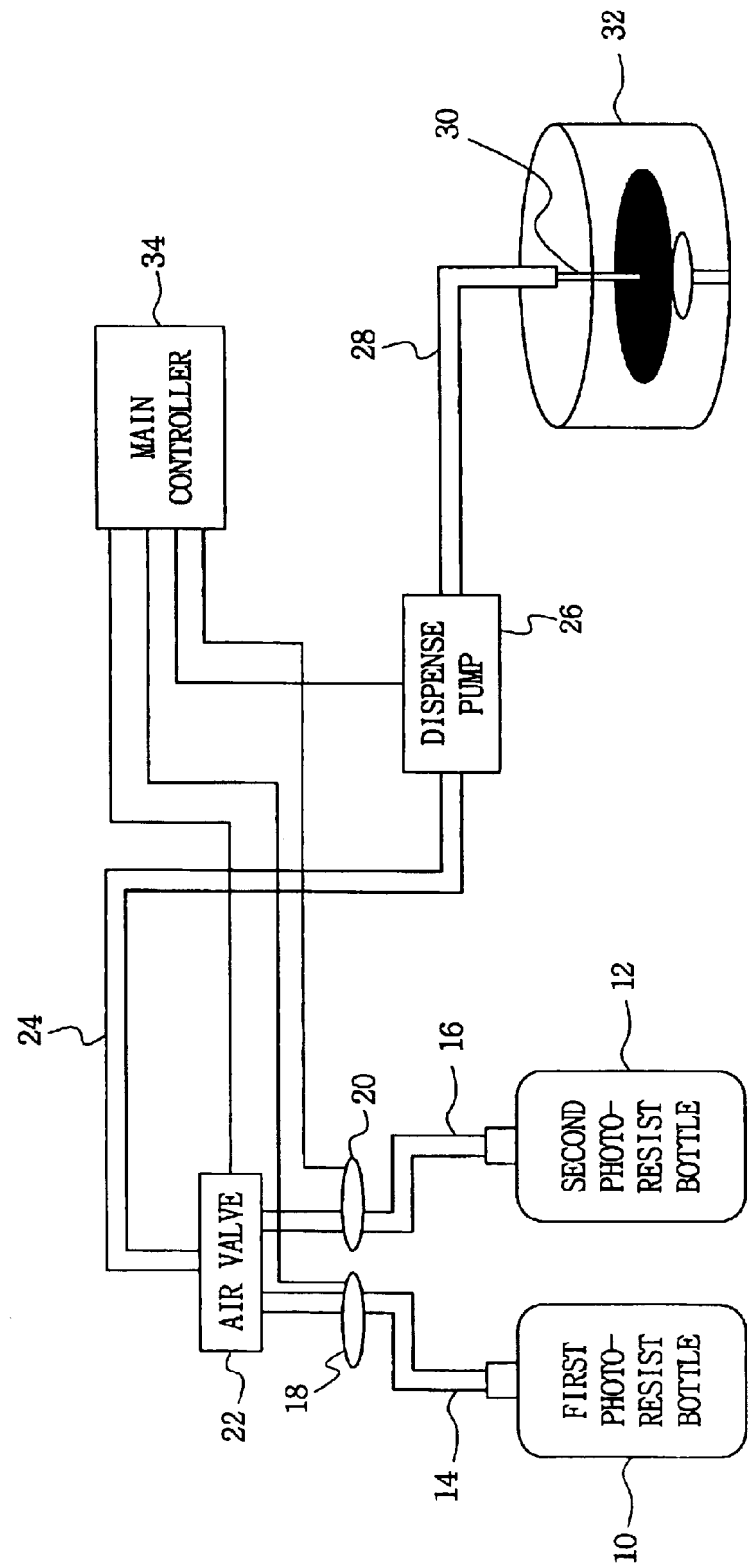
FIG. 1 is a block diagram of a conventional photoresist supply device of semiconductor coating equipment.
Figure 2:
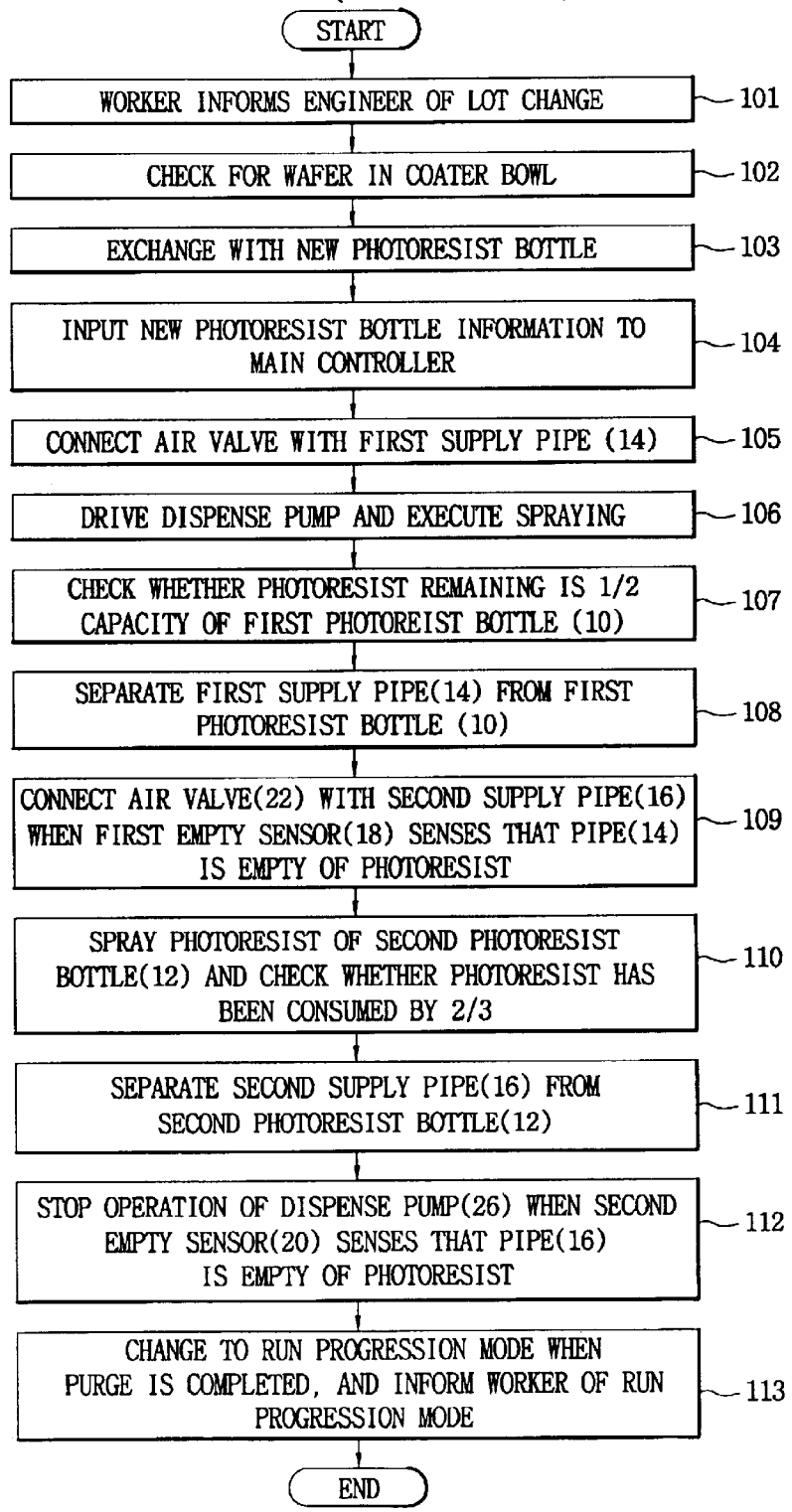
FIG. 2 is a flowchart of a conventional method of exchanging photoresist bottles when a new lot of wafers are to be coated.
Figure 3:
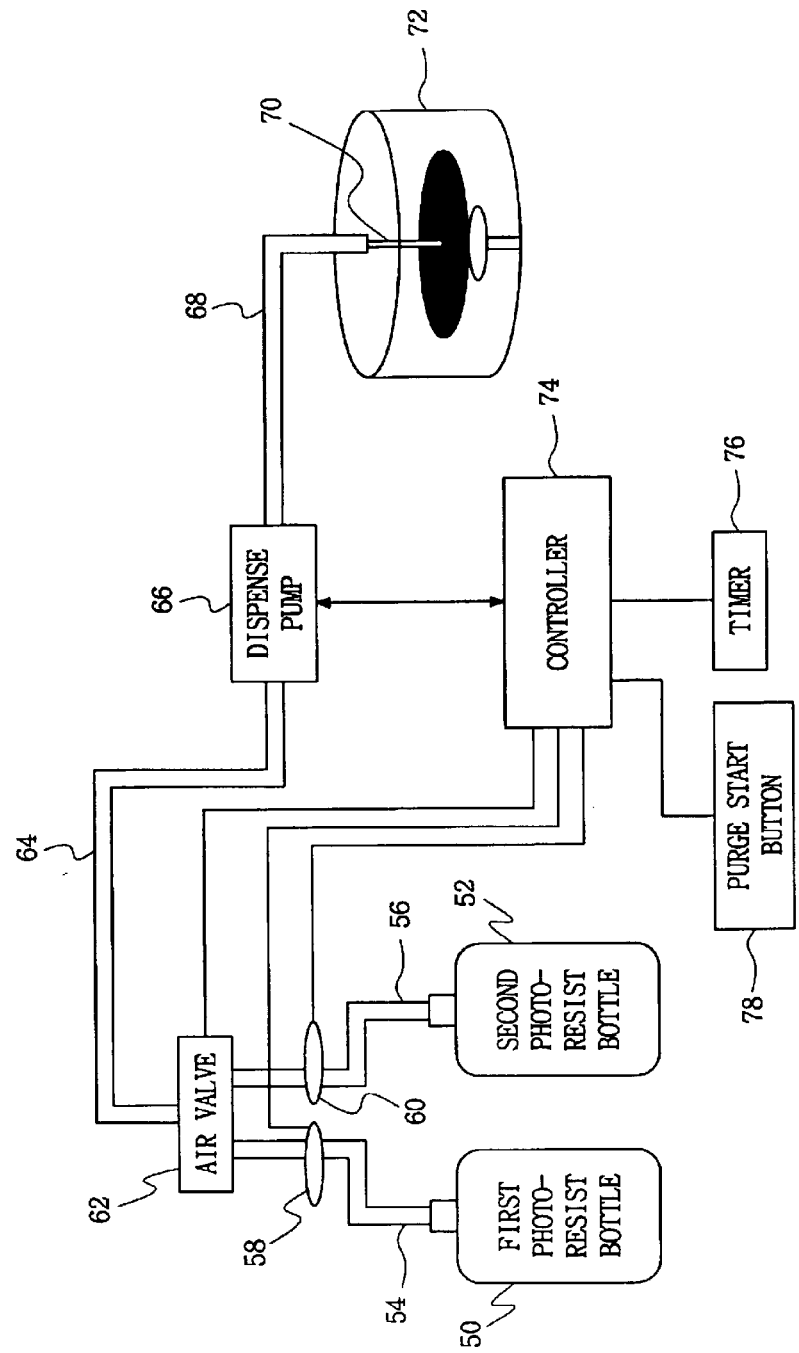
FIG. 3 is a block diagram of a photoresist supply device of semiconductor coating equipment according to the present invention.

As shown in FIG. 3, a photoresist supply device of semiconductor coating equipment according to the present invention includes a plurality of photoresist bottles 50, 52 storing the same kind of photoresist. First and second supply pipes 54, 56 are respectively connected to upper parts of the plurality photoresist bottles 50, 52. First and second empty sensors 58, 60 are disposed in-line with the first and second supply pipes 54, 56 for sensing when the first and second supply pipes 54, 56 are empty, respectively. A pneumatically actuated directional flow control valve or valves 62 is/are connected to the first and second supply pipes 54, 56. The valve 62 is movable, in response to a given control signal, to selectively supply the photoresist in the first and second supply pipes 54, 56 to a third supply pipe 64 connected to the valve 62. A dispense pump 66 is connected to the third supply pipe 64 for pressurizing the photoresist flowing through the third supply pipe 64. A fourth supply pipe 68 is connected between the dispense pump 66 and a nozzle 70. The third and fourth supply pipes 64, 68 make up a supply line for supplying photoresist to the nozzle 70. The nozzle 70 sprays the photoresist supplied through the supply line onto a wafer supported within a coater bowl 72.

In addition, the photoresist supply device includes a controller 74 connected to the dispense pump 66 for controlling the operation of the pump 66. A purge start button (input member) 78 is connected to the controller 74 for generating a purge start command signal that can be input to the controller. A timer 76 is connected to the controller 74 so as to begin counting when initialized by the controller 74 and so that the controller 74 can determine when a predetermined period of time has elapsed since the timer 76 was initialized.

Figure 4:
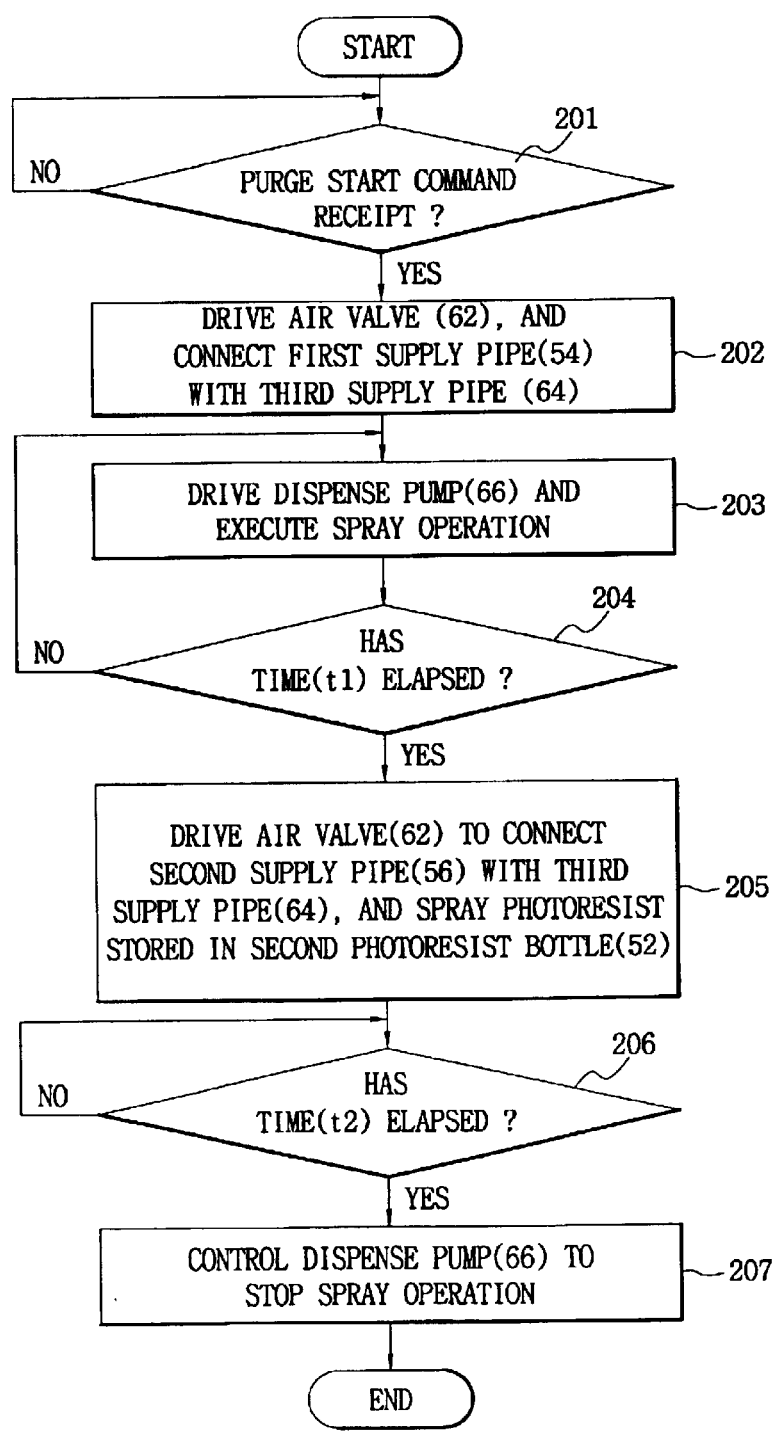
FIG. 4 is a flowchart of a method of purging photoresist when exchanging photoresist bottles according to the present invention.

Referring now to FIGS. 3 and 4, when the job lot changes and the plurality of photoresist bottles 50, 52 are changed, a worker just presses the purge start button 78 connected to the controller 74. The purging of the photoresist from the system thus begins to be executed automatically without the need for the worker to inform an engineer. The purging method is also carried out without the need for the engineer to observe the purging of the photoresist.

The worker, however, as is conventional per se, first checks whether the last wafer has been transferred from the coater bowl 72 at the end of a photoresist coating process of one lot. Once a wafer is not present in the coater bowl 72, the worker presses the purge start button 78 to initiate the photoresist purge operation. At this time, the controller 74 is performing a self-check to determine whether a purge start command signal has been received from the purge start button 78 (101).

The controller 74 drives the valve(s) 62 to place the first supply pipe 54 in communication with the third supply pipe 64 when the purge start command signal is received (202). That is, the photoresist supply line 54 connected to the newly provided first photoresist bottle 50 is opened, and the photoresist supply line 56 connected to the photoresist bottle 52 is closed.

The controller 74 also drives the dispense pump 66 to spray photoresist into the empty coater bowl 72 (203). At the same time, the controller 74 initializes the timer 76 and begins to check whether the first predetermined time period t1 has elapsed (204). The photoresist is continuously sprayed from the first photoresist bottle 50 until the time period t1 elapses. The first time period t1 is the predetermined time it takes for the pump 66 to purge the photoresist filling the first supply pipe 54 and thereby fill the pipe 54 with new photoresist, and is about 10 to 15 minutes in practice, for example.

When the first determination time t1 elapsed, the controller 74 drives the valve(s) 62 to place the second supply pipe 56 in communication with the third supply pipe 64, and operates the pump 66 to spray the photoresist into the coater bowl 72 (205). At this time, the controller 74 also initializes the timer 76 and begins to check whether a second predetermined period of time t2 has elapsed (206) since the re-initializing of the timer 76. Hence, the photoresist is continuously sprayed from the newly provided bottle 52 during the second time period t2. The second period of time t2 is the predetermined time it takes for the second supply pipe 56 to be purged of the previous photoresist and filled with new photoresist, as well as the time it takes for the third supply pipe 64, the dispense pump 66 and the fourth supply pipe 68 to be purged and then filled with the new photoresist. In practice, the second predetermined period of time is, for example, about 20 to 25 minutes.

The controller 74 controls the dispense pump 66 to stop spraying the photoresist once the second predetermined period of time t2 has elapsed (207). Accordingly, the photoresist purge operation is finished.

As described above, in accordance with the present invention, the time at which all previous photoresist has been purged from semiconductor device coating equipment can be accurately determined after a job lot has been completed. Thus, the loss of photoresist associated with the purge operation is minimized. In addition, the present invention saves manpower because the purge operation does not have to be monitored by eye. Still further, the present invention saves skilled manpower because the purge operation can be initiated simply by pressing a button. Accordingly, the present invention curtails the costs associated with the purge operation of the semiconductor device coating process.

Finally, although the present invention was described in detail above in connection with the preferred embodiments thereof, the scope of the invention is not so limited. Rather, various changes and modifications of the preferred embodiments, as will become apparent to those of ordinary skill in the art, are seen to be within the true spirit and scope of the invention as defined by the appended claims.

What is claimed is:

1. A photoresist supply device of semiconductor wafer coating equipment, comprising:

a plurality of photoresist storage bottles;

a plurality of supply pipes respectively connected to the plurality photoresist bottles;

a supply line connected to said supply pipes downstream thereof;

at least one flow direction control valve disposed in line with said supply pipes upstream of said supply line and movable, in response to a control signal, to place a selected one of any of the supply pipes in communication with said supply line;

a dispense pump operatively connected to said supply line so as to pressurize photoresist in the supply line;

a nozzle disposed at an end of said supply line to spray the photoresist pressurized by said dispense pump;

a purge start input member actuatable to issue a purge start command signal;

an electronic timer; and a controller operatively connected to said purge start input member so as to receive the purge start command signal therefrom when the input member is actuated, and operatively connected to said electronic timer, said dispense pump and said at least one valve so as to control the operations of said dispense pump and said at least one valve according to a sequence established using said timer, wherein the supply pipes and the supply line are automatically purged of photoresist once the command signal is received.

2. The device of claim 1, wherein said controller is operative upon receiving said purge command signal to initialize said timer and to move said at least one valve to a position that allows the photoresist to be supplied from one of the plurality of supply pipes to said supply line, is operative to move said at least one valve to a position that prevents the photoresist from being supplied from said one of the plurality of supply pipes to said supply line and allows photoresist to be supplied from another of the plurality of supply pipes to said supply line once said timer has measured a first period of time from when it was initialized, and to re-initialize said timer, and is operative to stop the spraying of photoresist from said nozzle after said timer has measured a second period of time t2 from when it was re-initialized.

3. The device of claim 1, wherein said plurality of photoresist storage bottles and supply pipes comprise first and second supply pipes respectively connected to first and second photoresist storage bottles, and said at least one valve comprises a multi-position directional flow control valve disposed in-line with the first and second supply pipes.

* * * * *